United States Patent
Li et al.

(10) Patent No.: US 9,478,797 B2
(45) Date of Patent: Oct. 25, 2016

(54) SYSTEM, METHOD AND APPARATUS FOR FORMING A THIN FILM LITHIUM ION BATTERY

(71) Applicant: Applejack 199 L,P., San Jose, CA (US)

(72) Inventors: Wenming Li, San Jose, CA (US); Byunghoon Yoon, San Jose, CA (US); Ann Koo, San Jose, CA (US)

(73) Assignee: APPLEJACK 199 L.P., San Jose, CA (US)

(*) Notice: Subject to any disclaimer, the term of this patent is extended or adjusted under 35 U.S.C. 154(b) by 335 days.

(21) Appl. No.: 13/750,825

(22) Filed: Jan. 25, 2013

(65) Prior Publication Data

US 2014/0212735 A1    Jul. 31, 2014

(51) Int. Cl.
| | |
|---|---|
| H01M 4/06 | (2006.01) |
| H01M 4/08 | (2006.01) |
| H01M 6/18 | (2006.01) |
| H01M 4/134 | (2010.01) |
| H01M 4/1395 | (2010.01) |
| H01M 10/04 | (2006.01) |
| H01M 10/052 | (2010.01) |
| H01M 10/0562 | (2010.01) |
| H01M 10/058 | (2010.01) |
| H01M 4/04 | (2006.01) |
| H01M 10/0585 | (2010.01) |

(52) U.S. Cl.
CPC .......... *H01M 4/134* (2013.01); *H01M 4/0426* (2013.01); *H01M 4/1395* (2013.01); *H01M 10/0436* (2013.01); *H01M 10/052* (2013.01); *H01M 10/058* (2013.01); *H01M 10/0562* (2013.01); *H01M 10/0585* (2013.01); *Y02E 60/122* (2013.01); *Y10T 29/49115* (2015.01)

(58) Field of Classification Search
USPC .................. 429/209–246, 149–160, 96–100; 29/623.1–623.5
See application file for complete search history.

(56) References Cited

U.S. PATENT DOCUMENTS

| | | | |
|---|---|---|---|
| 6,828,063 B2 | 12/2004 | Park et al. | |
| 8,475,963 B2 | 7/2013 | Oukassi et al. | |
| 2002/0048705 A1* | 4/2002 | Park ...................... | H01M 4/134 429/219 |
| 2005/0074673 A1* | 4/2005 | Park et al. ............... | 429/231.95 |

(Continued)

FOREIGN PATENT DOCUMENTS

| | | |
|---|---|---|
| JP | 2003-115294 A | 4/2003 |
| JP | 2005-197080 A | 7/2005 |

(Continued)

OTHER PUBLICATIONS

Extended European Search Report dated Jul. 21, 2016 as received in Application No. 14743019.

(Continued)

*Primary Examiner* — Basia Ridley
*Assistant Examiner* — Caitlin Wilmot
(74) *Attorney, Agent, or Firm* — Maschoff Brennan

(57) ABSTRACT

A system and method of forming a thin film battery includes a substrate, a first current collector formed on the substrate, a cathode layer formed on a portion of the first current collector, a solid layer of electrolyte material formed on the cathode layer, a silicon-metal thin film anode layer formed on the solid layer of electrolyte material and a second current collector electrically coupled to the silicon-metal thin film anode layer. A method and a system for forming the thin film battery are also disclosed.

15 Claims, 9 Drawing Sheets

(56) References Cited

U.S. PATENT DOCUMENTS

| | | | |
|---|---|---|---|
| 2008/0032236 A1* | 2/2008 | Wallace | H01M 6/40 430/319 |
| 2008/0280201 A1 | 11/2008 | Konishiike et al. | |
| 2009/0317664 A1* | 12/2009 | Niessen et al. | 429/7 |
| 2012/0040233 A1* | 2/2012 | Kim et al. | 429/152 |

FOREIGN PATENT DOCUMENTS

| | | |
|---|---|---|
| JP | 2007299764 A | 11/2007 |
| JP | 2010-121195 A | 6/2010 |
| JP | 2012-520552 A | 9/2012 |
| KR | 10-2002-0038917 A | 5/2002 |
| WO | 2006/082846 A1 | 8/2006 |
| WO | 2013/012549 A2 | 1/2013 |

OTHER PUBLICATIONS

Hwang, C.-M., and Park, J.-W., "Electrochemical characterizations of multi-layer and composite silicon-germanium anodes for Li-ion batteries using magnetron sputtering", Journal of Power Sources, vol. 196, Issue 16, Aug. 15, 2011, pp. 6772-6780.

Pan, H., et al., "In-situ dilatometric study of Metal/Si multilayer film electrodes", Thin Solid Films, vol. 519, Issue 2, Nov. 1, 2010, pp. 778-783.

Bates et al., Thin-film lithium and lithium-ion batteries, Elsevier Science B.V., Solid State Ionics 135 (2000) 33-45.

Japanese Office Action for con-esponding application No. JP 2015-555198, mailed Aug. 9, 2016.

Korean Office Action for corresponding application No. 10-2015-7022766, mailed Aug. 22, 2016.

* cited by examiner

SYSTEM, METHOD AND APPARATUS FOR FORMING A THIN FILM LITHIUM ION BATTERY

The present invention relates generally to electrical power storage systems, and more particularly, to thin film battery systems and methods of forming thin film batteries.

Modern lifestyles demand the use of more and more portable electric devices. The portable electric devices include personal electronics (e.g., cellphones, cameras, toys, etc.) to cordless power tools and electrical appliances to electric and hybrid-electric vehicles. The increased demand for portable electronic devices also demands increases in storage capacity and service life for the portable electrical power storage systems.

Typical portable electrical power storage systems, e.g., various types of batteries, have relatively poor storage capacity per unit weight and have a relative high cost. As a result, the performance of heavy electrical power demanding uses such as cordless power tools, electrical appliances and electric and hybrid-electric vehicles are limited by cost and weight of the battery. In view of the foregoing, there is a need for lighter weight, higher capacity, lower cost electrical power storage system.

SUMMARY

Broadly speaking, the present invention fills these needs by providing a lighter weight, higher capacity, lower cost electrical power storage system. It should be appreciated that the present invention can be implemented in numerous ways, including as a process, an apparatus, a system, computer readable media, or a device. Several inventive embodiments of the present invention are described below.

One embodiment provides a thin film battery includes a substrate, a first current collector formed on the substrate, a layer of ion containing material formed on a portion of the first current collector, a layer of electrolyte material formed on the layer of ion containing material, a silicon-metal thin film anode layer formed on the layer of electrolyte material and a second current collector electrically coupled to the silicon-metal thin film anode layer.

The silicon-metal thin film anode layer can include multiple pairs of alternating layers of material wherein a first layer of the pair of alternating layers contains silicon and a second layer of the pair of alternating layers can contain at least one of carbon, tin, silver, aluminum, indium, titanium, thallium or copper or combinations thereof. Each pair of the plurality of pairs of alternating layers can have a thickness of between about 2 nanometers and about 500 nanometers. A first layer of the pair of alternating layers can have a thickness of between about 1 nanometer and about 499 nanometers. The second layer of the pair of alternating layers can have a thickness of between about 1 nanometer and about 499 nanometers.

The silicon-metal thin film anode layer can include between about 1% to about 99% of a first one of the pair of alternating layers of material and between about 99% to about 1% of a second one of the pair of alternating layers of material. A sum of the thicknesses of the first current collector, cathode the layer of ion containing material, the layer of electrolyte material and the silicon-metal thin film anode layer can be between about 10 micrometers to about 50 micrometers. The silicon-metal thin film anode layer can have a thickness of between about 2 micrometers and about 10 micrometers. The substrate can be a flexible substrate.

Another embodiment provides a method of forming a thin film battery. The method includes forming a first current collector on a substrate, forming a lithium ion containing cathode layer on the first current collector, forming an electrolyte layer on the lithium ion containing cathode layer, forming silicon-metal thin film anode layer on the electrolyte layer and coupling the silicon-metal thin film anode layer to a second current collector.

The silicon-metal thin film anode layer includes multiple pairs of alternating layers of material that can be formed in a single processing chamber having at least two sources and a transport system and wherein forming the alternating layers of material includes transporting the substrate across each one of the at least two sources in an alternating manner. The multiple pairs of alternating layers of material can be formed in a rotary processing chamber having at least two sources and a rotary transport system and wherein forming the alternating layers of material includes transporting the substrate across each one of the at least two sources in an alternating manner.

Yet another embodiment provides a system for making a thin film battery. The system includes a chamber having at least two sources and a transport system capable of transporting a substrate across each one of the at least two sources in an alternating manner. The chamber can also include a gas curtain between each of the at least two sources. The chamber can also include a partial wall between each of the at least two sources.

The system can also include a controller. The controller including logic stored on a computer readable medium for forming a first current collector on a substrate, logic stored on a computer readable medium for forming a lithium ion containing cathode layer on the first current collector, logic stored on a computer readable medium for forming a solid electrolyte layer on the ion containing layer, logic stored on a computer readable medium for forming silicon-metal thin film anode layer on the electrolyte layer and logic stored on a computer readable medium for coupling the silicon-metal thin film anode layer to a second current collector.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for a lighter weight, higher capacity and lower cost electrical power storage system will now be described. It will be apparent to those skilled in the art that the present invention may be practiced without some or all of the specific details set forth herein.

Silicon-metal thin film anode materials can be used to form a thin film Lithium ion battery. Various methods of can be used to form a hybrid silicone (Si)-carbon (C) or a hybrid silicone (Si)-soft metal (e.g., Tin (Sn), Silver (Ag), Aluminum (Al), Indium (In), titanium (Ti), Thallium (Tl) and Copper (Cu)) in thin films that can be used as anode materials for thin film Li ion batteries. The thin film structure also allows tunable mechanical, chemical and electrical properties. One example of this new class of thin film anode materials as a binary sequential deposition system is the reaction of Si and Sn to deposit the hybrid of Si—Sn thin film layer using physical vapor deposition (PVD) and/or chemical vapor deposition (CVD).

Figure 1A:
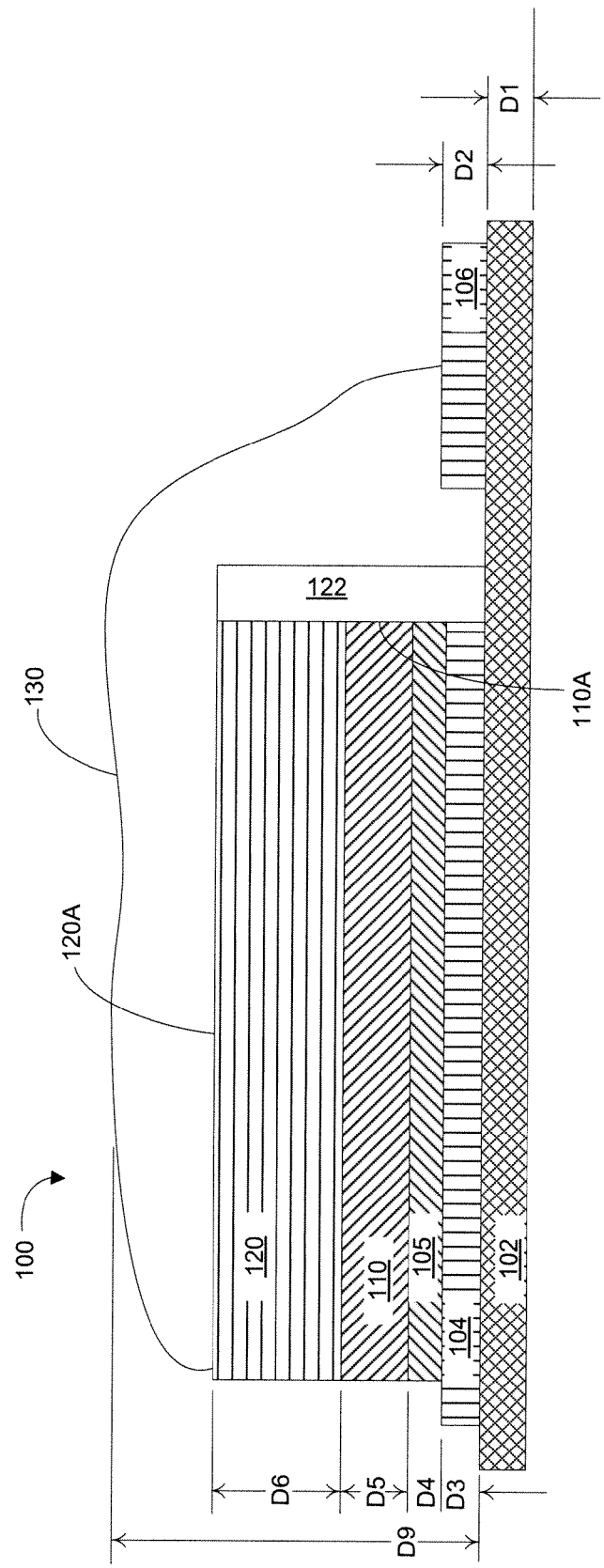
FIG. 1A is a cross-sectional view of a thin film battery, in accordance with embodiments of the present invention.

FIG. 1A is a cross-sectional view of a thin film battery 100, in accordance with embodiments of the present invention. The thin film battery 100 includes a non-conductive base substrate 102. The substrate 102 can be flexible or substantially non-flexible. By way of example, the substrate 102 can be formed from a silicon or glass or a ceramic or a flexible polymer or any other suitable substrate capable of supporting the layers 104, 105, 110, 120, described in more detail below.

Current collectors 104 and 106 are conductive materials such as metals or any other suitable conductive material. By way of example, the first current collector 104 and second current collector 106 can be aluminum or copper and combinations and alloys thereof. The current collectors 104, 106 provide terminals for the thin film battery structure 100. The current collectors 104, 106 have a thickness D2, D3, respectively of about 1000 Angstrom or thicker. It should be understood that the layers 102, 104, 105, 110 120 130 are not drawn to scale. Further, it should be understood that the first current collector 104 thickness D2 may be less or greater than the second current collector 106 thickness D3.

Lithium containing layer 105 is formed on the current collector 104. The lithium containing layer 105 can include one or more layers of at least one of a $LiCoO_2$ (lithium cobalt oxide) and/or $LiNiO_2$ (lithium nickel oxide), and/or $LiMnO_2$ (lithium manganese oxide), and/or $LiMn_2O_4$ (lithium manganese dioxide), and/or any other suitable lithium or similar ion source material and combinations thereof. The lithium containing layer 105 has a thickness D4 of between about 8 and about 40 micrometers.

An electrolyte layer 110 is formed over the lithium containing layer 105. The electrolyte layer includes LiPON (lithium phosphorous oxynitride). The electrolyte layer 110 has a thickness D5 of between about 0.5 to about 10 micrometers.

A silicon-metal thin film anode layer 120 is formed on the electrolyte layer 110. The silicon-metal thin film anode layer 120 is described in more detail below. The silicon-metal thin film anode layer 120 has a thickness D6 of between about 2 and about 10 micrometers. The silicon-metal thin film anode layer 120 can have a thickness D6 greater than about 2 and about 10 micrometers.

An insulator 122 is formed on a side 110A of the material stack of layers 104, 105, 110, 120. A conductive layer 130 is formed over the silicon-metal thin film anode layer 120. The insulator 122 insulates the side 110A of the material stack of layers 104, 105, 110, 120 from the conductive layer 130. The conductive layer 130 has a thickness of between about 2 and about 5 micrometers. The conductive layer 130 electrically couples the top surface 120A of the silicon-metal thin film anode layer 120 to the second current collector 106. The conductive layer 130 can be deposited only on the top surface 120A of the silicon-metal thin film anode layer 120 and coupled to the second current collector 106 by a wire or similar conductive structure.

Figure 1B:
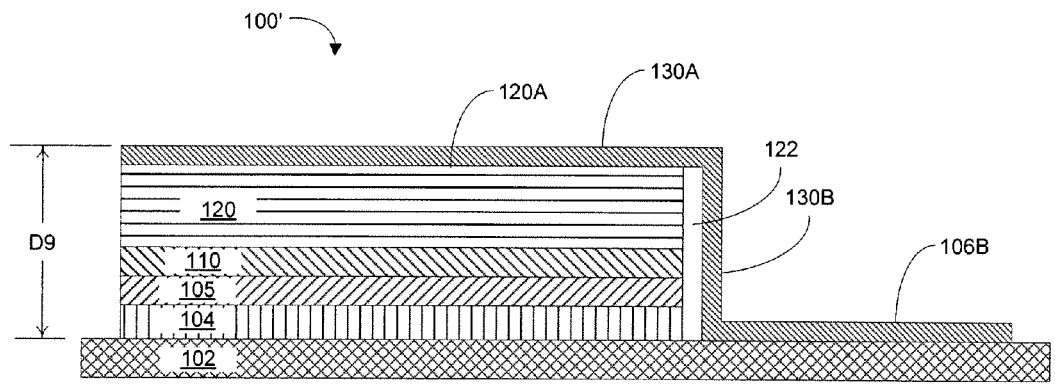
FIG. 1B is a cross-sectional view of an alternative thin film battery, in accordance with embodiments of the present invention.

FIG. 1B is a cross-sectional view of an alternative thin film battery 100', in accordance with embodiments of the present invention. The alternative thin film battery 100' includes an alternative second current collector 106B structure formed by conductive layer 130 on the top of the material stack 104, 105A, 105B, 120, 110 and the substrate 102 thus negating a need for the second current collector 106 structure described in FIG. 1A above.

Figure 1C:
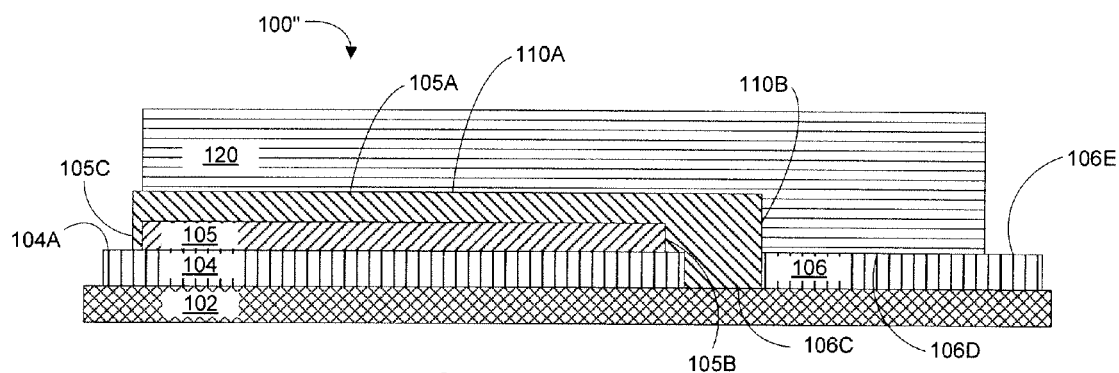
FIG. 1C is a cross-sectional view of an alternative thin film battery, in accordance with embodiments of the present invention.

FIG. 1C is a cross-sectional view of an alternative thin film battery 100", in accordance with embodiments of the present invention. The alternative thin film battery 100" includes the second current collector 106 structure as described above. The electrolyte layer 110 is formed over the lithium containing layer 105 such that the electrolyte layer encompasses both the top 105A and both ends 105B, 105C of the lithium containing layer. The electrolyte layer 110 does not cover a portion 104A of the first current collector 104. The electrolyte layer 110 also extends over a portion 106C of the second current collector 106.

The silicon-metal thin film anode layer 120 is formed over the top surface 110A of the electrolyte layer 110 and a second portion 106D of second current collector 106 structure. The silicon-metal thin film anode layer 120 covers at least the end 110B extending over a portion 106C of the second current collector 106. A third portion 106E of the second current collector 106 structure remains uncovered and accessible as the anode electrical terminal of the alternative thin film battery 100". The uncovered portion 104A of the first current collector 104 is accessible for use as the cathode terminal of the alternative thin film battery 100".

Figure 1D:
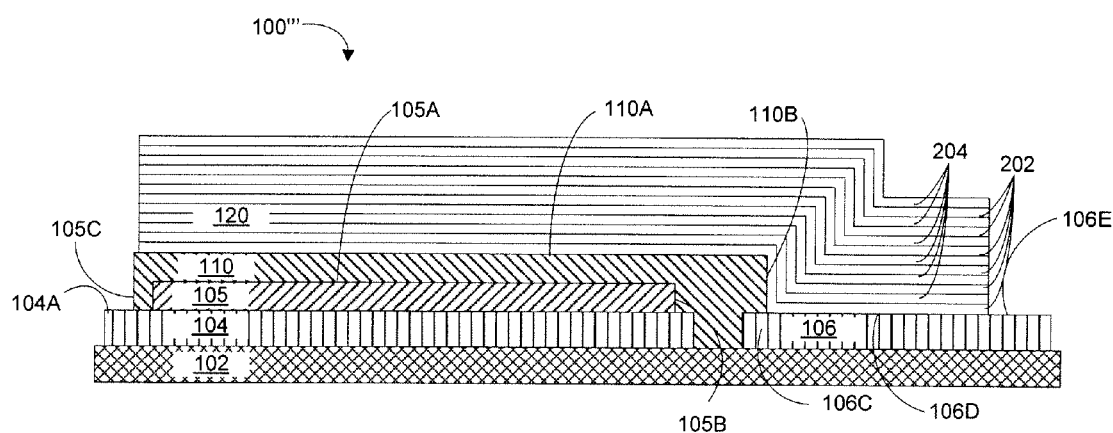
FIG. 1D is a cross-sectional view of an alternative thin film battery, in accordance with embodiments of the present invention.

FIG. 1D is a cross-sectional view of an alternative thin film battery 100''', in accordance with embodiments of the present invention. The alternative thin film battery 100''' is substantially similar to the alternative thin film battery 100" described in FIG. 1C above. The alternative thin film battery 100'" shows the silicon-metal thin film anode layer 120 formed in a series of thin, alternating conformal layers 202, 204 over the top surface 110A of the electrolyte layer 110 and a second portion 106D of second current collector 106 structure. The silicon-metal thin film anode layer 120 covers at least the end 110B extending over a portion 106C of the second current collector 106.

Figure 2A:
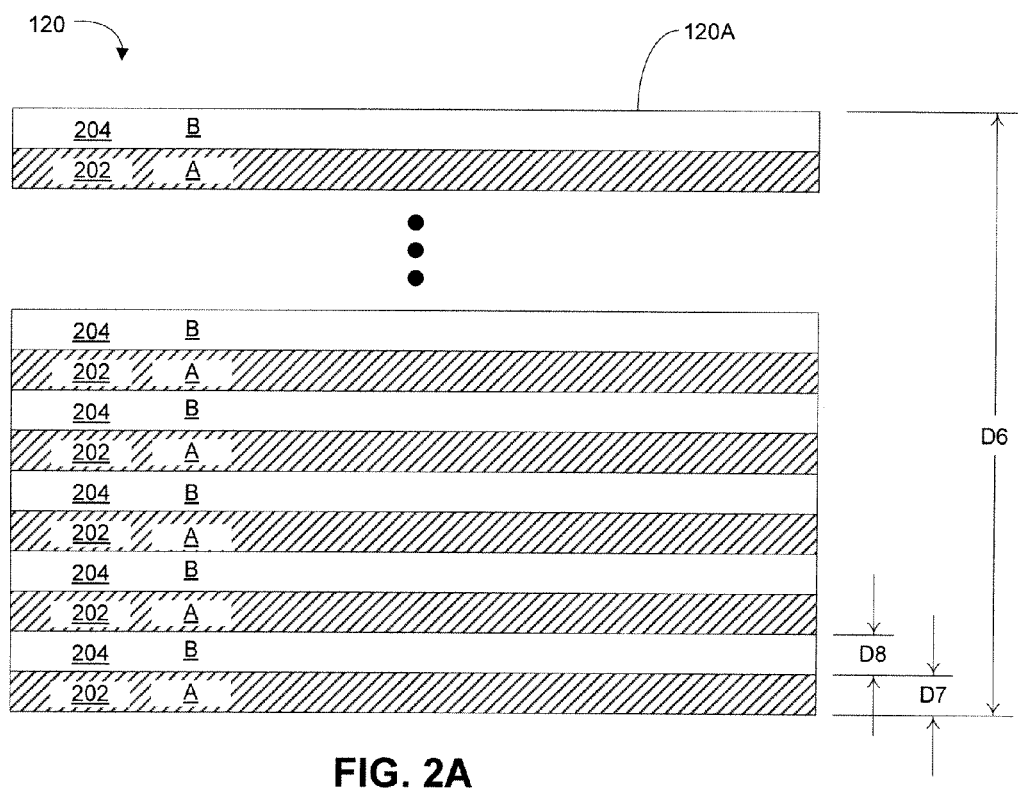
FIG. 2A is a cross-sectional view of a silicon-metal thin film anode layer, in accordance with embodiments of the present invention.

FIG. 2A is a cross-sectional view of a silicon-metal thin film anode layer 120, in accordance with embodiments of the present invention. The silicon-metal thin film anode layer 120 includes multiple alternating pairs of layers 202, 204. Each of the multiple alternating layers 202, 204 has a respective thickness D7 and D8 of between about 1 and about 500 nanometers.

The A layers 202 can be thin layer of silicon material. The B layers 204 can be a carbon (e.g., graphite) material as non-metallic thin layer. Alternatively, the B layers 204 can be thin metallic materials such as tin (Sn), silver (Ag), aluminum (Al), indium (In), titanium (Ti), Thallium (Tl) and copper (Cu) or combinations thereof. The B layers 204 can also be combinations of carbon and metallic materials. The alternating A material layer and B material layer forms a superlattice structure of the silicon-metal thin film anode layer 120.

The alternating AB materials in layers 202, 204 to form the superlattice structure of the silicon-metal thin film anode layer 120 can be formed in several different combinations. By way of example, such as AB, $ABAB_1$, $ABAB_1AB_2$ or $ABAB_1AB_2AB_3$ etc., where each of B, B1, B2, B3, etc. are respective different carbon or metallic materials as described above.

The thickness of each layer 202, 204 in the silicon-metal thin film anode layer 120 can be between about 1 nm to about 500 nm. By way of example, if the A material layer 202 is about 1 nm of thickness D7 then the B material layer can have a thickness D8 of up to about 499 nm. A thickness of each pair of alternating AB material layers 202 204 can be between about 2 nm and about 500 nm.

Figure 2B:
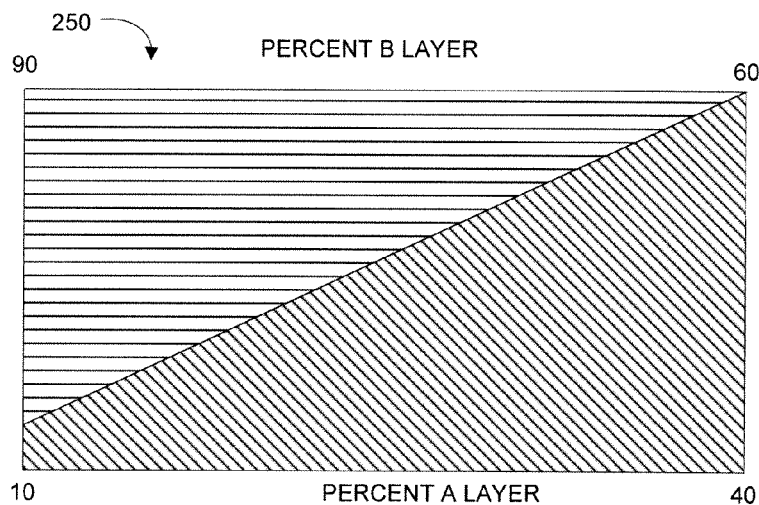
FIG. 2B is a graph of the percentage of the AB layers of the anode, in accordance with embodiments of the present invention.

FIG. 2B is a graph 250 of the percentage of the AB layers of the anode, in accordance with embodiments of the present invention. The anode superlattice structure was fabricated by alternatively deposited thin layers of A material layer (e.g., silicone) and B material layers (e.g., tin). The total thickness range of anode is 2-10 μm. In this thickness, the A layer and the B layer have materials combinations and the thickness of each layer has specific ratios of thicknesses to the lithiation function. The ratio of thickness of the A layer to the B layer can be between 1:9, 2:8, 3:7, 4:6.

The ratio composition of each AB material layers 202 204 can be from between about 1% to about 99% of each of the of the AB materials. An A to B ideal ratio can be between about 10% (Si)/90% (Sn) to about 40% (Si)/60% (Sn). The AB layer can be formed by PVD, CVD thin film deposition, layer by layer self-assembly, ink jet printing etc.

Figure 2C:
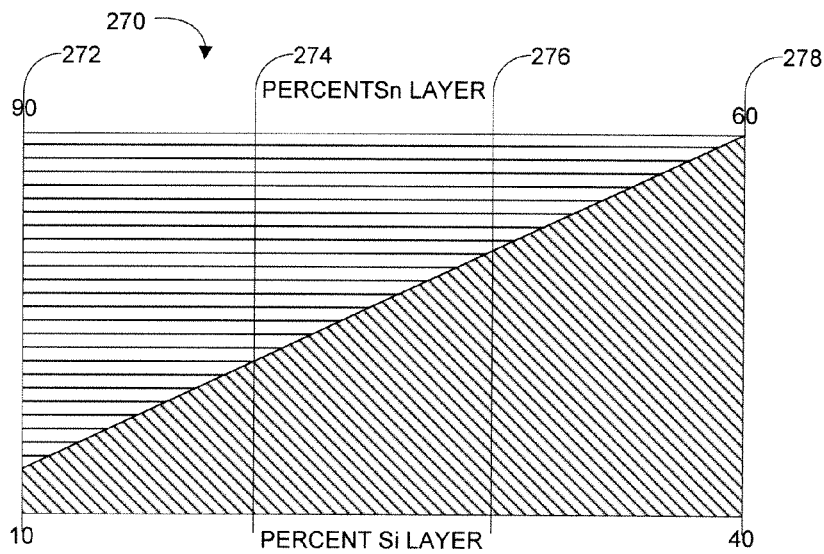
FIG. 2C is a graph of the percentage of multiple AB layers of the anode, in accordance with embodiments of the present invention.

FIG. 2C is a graph 270 of the percentage of multiple AB layers of the anode, in accordance with embodiments of the present invention. As described above, the anode layer can be formed in different ratios. For example, a first anode, shown at line 272, has a ratio of 10% Si and 90% Sn. A second anode, shown at line 274 has a ratio of 20% Si and 80% Sn. A third anode, shown at line 276, has a ratio of 30% Si and 70% Sn. A fourth anode, shown at line 278, has a ratio of 40% Si and 60% Sn.

The superlattice structure of the silicon-metal thin film anode layer 120 can be formed using several different deposition techniques. Gas phase deposition methods for the superlattice structure of the silicon-metal thin film anode layer 120 can include sputtering deposition such as radio frequency (RF) sputtering, direct current (DC) sputtering, chemical vapor deposition (CVD), plasma-enhanced chemical vapor deposition (PECVD), metal-organic chemical vapor deposition (MOCVD), atomic layer deposition (ALD), molecular layer deposition (MLD) and laser-assisted deposition (LAD).

Physical vapor deposition (PVD) methods such as RF sputtering for conducting and non-conducting materials and DC sputtering for conducting materials are widely applied for thin film fabrications.

Figure 2D:
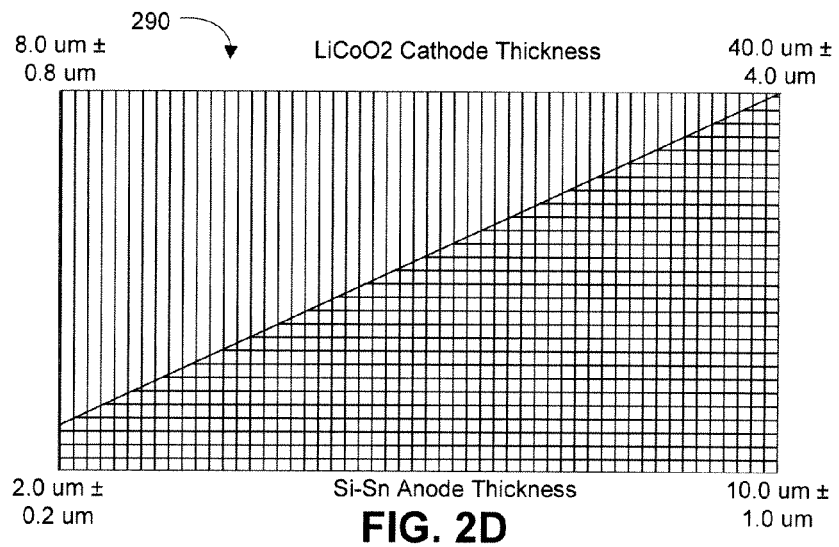
FIG. 2D is a graph of the thicknesses of the cathode and anode layers, in accordance with embodiments of the present invention.

FIG. 2D is a graph 290 of the thicknesses of the cathode and anode layers, in accordance with embodiments of the present invention. The total thickness of the cathode, $LiCoO_2$, is 8-40 μm while the total thickness of electrolyte, LiPON, is between about 0.5-10 μm. The thickness ratio between cathode and anode, $LiCoO_2$ cathode is about four times thicker than Si—Sn anode in the thin film Li ion battery. For example, if the anode thickness is 2 μm then the cathode thickness is 8 μm shown in FIG. 2C. This four times thicker cathode improves the lithiation. The electrolyte (LiPON) thickness can be varied due to the density dependence.

Figure 3A:
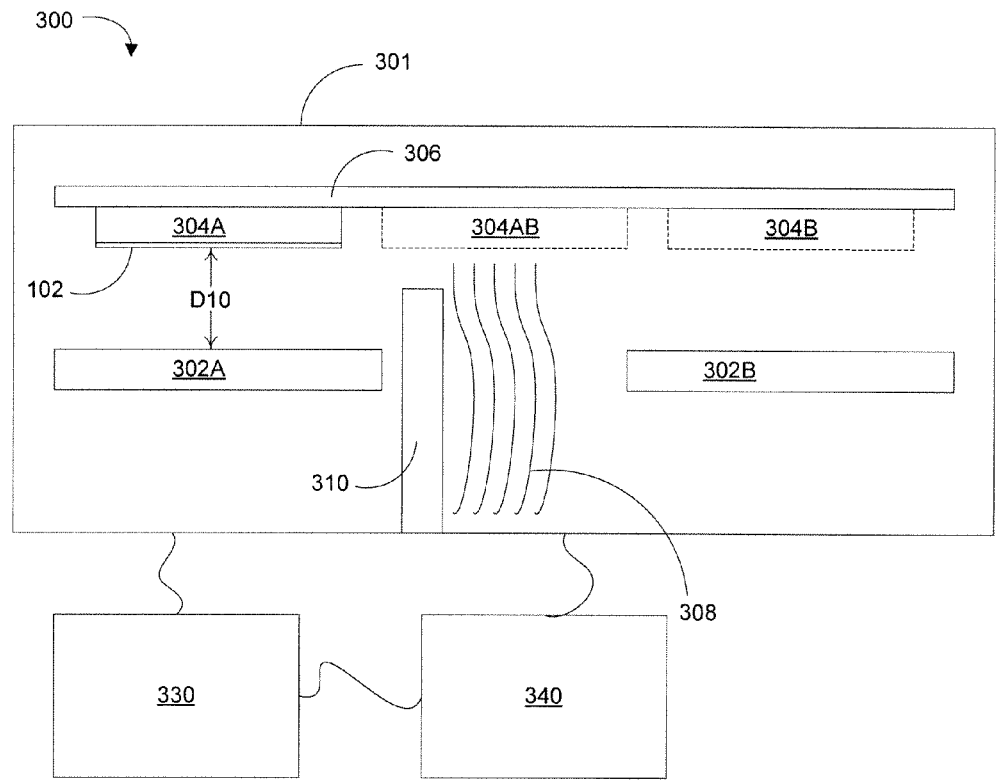
FIG. 3A is a simplified schematic view of a deposition system, in accordance with embodiments of the present invention.

FIG. 3A is a simplified schematic view of a deposition system 300, in accordance with embodiments of the present invention. The deposition system 300 includes a chamber 301 having a substrate transportation system 306 and multiple deposition stations 304A, 304B. Each of the multiple deposition stations 304A, 304B has a corresponding deposition source 302A, 302B. It should be understood that more than two deposition stations and respective sources can be included in the chamber 301.

A substrate 102 can be transported in directions 303A and 303B by the transportation system 306 to alternate between each of the deposition stations 304A, 304B. A controller 330 and one or more process gas source(s) 340 are also coupled to the chamber 301. The chamber 301 also includes a gas curtain 308 or a vacuum and/or one or more physical structures (e.g., partial wall) 310 separating the deposition stations 304A, 304B.

A sputtering technique is used to sputter the respective AB materials from each of the respective deposition sources 302A, 302B. A silicon source and the selected metal source can be used to form AB layer, because silicon and metal are both single element materials and thus the deposited thin films are copy the source material target and form a clear interface.

The substrate 102 can be moved in directions 303A, 303B at a speed of between about 0.1-4.0 meter per minute. The sources 302A, 302B are separated from the substrate 102 a distance D10 of between about 7 and about 14 cm. Each of the sources 302A, 302B are surrounded by one or more process gases supplied from the process gas source(s) 340.

The substrate transportation 306 can be reversible and can accept a roll-to-roll system for flexible substrate materials in order to enable multi-step sputtering deposition or plasma-enhanced chemical vapor deposition (PECVD) processing without opening the chamber 301. The deposition system 300 provides conformal and stable deposition of inorganic multilayers as superlattice anode thin films to form the silicon-metal thin film anode layer 120.

The substrate holder and sources 302A, 302B can have a rectangular shape and can be formed from any suitable material. By way of example, stainless steel and other metals such as aluminum and other materials such as copper and combinations thereof can be used to form the substrate holder and sources 302A, 302B. Stainless steel vessel is ideal for transporting substrates in vacuum, or under atmospheric pressure and ambient temperature conditions. The substrate holder has a molded end piece to grip and easier handling of the vessel.

In one embodiment, the substrate holder is about 20 inches (50 cm) in length, about 10 inches (25 cm) in width and about 0.5 inch (1.2 cm) in depth. The sources 302A, 302B, can be about 12 inches (30 cm) in length, about 6 inches (15 cm) in width and about 0.5 inch (1.2 cm) in depth.

The thin film lithium ion battery includes three different parts as described above: the electrodes (anode and cathode) and the electrolyte. The electrodes and the electrolyte are in solid state form in the lithium ion battery. The solid electrolyte is a lithium ion conducting layer between the cathode and the anode. During the charging operational phase, lithium ions move from the cathode to the anode through the Li ion conducting solid electrolyte layer. During the discharge operational phase, lithium ions move back from the anode to the cathode via the same lithium ion conducting solid electrolyte layer. Electrochemical lithium ion insertion and extraction into the silicon layers 202 during charging/discharging of the battery 100 can cause stress by the expansion caused by the lithium ion into the silicon in the silicon-metal thin film anode layer 120. Lithium ion insertion into silicon can result in a volume increase of as much as about 400% to the silicon in the anode 120. This expansion can cause decay or decomposition of the anode. The superlattice structure of the silicon-metal thin film anode layer 120 can release the volume increasing stresses easier than a typical monolithic anode structure. The alternating layers of silicon-metal thin film in the superlattice structure of the silicon-metal thin film anode layer 120 control volume expansion of the silicon due to the electrochemical lithium ion insertion. The thin film, uniform thickness throughout the silicon-metal thin film anode layer 120, provides short diffusion paths for lithium ions during the lithiation thus providing high rates of transport throughout the A material and B material layers 202, 204.

Electrochemical results of the hybrid silicon anode thin films show increased lithium ion conductivity and dramatically improved retention of capacity versus the charge/discharge cycle number as compared to typical anode structures. The volumetric energy density of the silicon-metal thin film anode layer 120 provides a very effective anode structure.

A sputtering gas such as an argon ion ($Ar^+$) or atom bombardment on a "source/target" 302A, 302B cause material to be ejected from the source onto the substrate 102. Sputtered atoms ejected from the source 302A, 302B have a wide energy distribution, up to tens of eV.

While sputtering is used in the deposition system 300, it should be understood that other deposition techniques could also be used instead of or in addition to the sputtering technique. Plasma-enhanced chemical vapor deposition (PECVD) has been often used in semiconductor manufacturing to deposit thin conformal films onto substrates containing metal layers or other temperature-sensitive structures. PECVD controlling initial nucleation step also yields some of the fastest deposition rates while maintaining film quality such as density, roughness and defect-free, as compared with sputter deposition and thermal/electron-beam evaporation, often at the expense of uniformity.

Metal-organic chemical vapor deposition (MOCVD) method has been used for epitaxial III-V semiconductor layers and can also be used for forming hybrid silicon-bimetallic or silicone-multimetallic thin films such as in the silicon-metal thin film anode layer 120.

Atomic layer deposition (ALD) is a thin film deposition technique that is based on the sequential gas phase reactions and self-limiting surface chemistries. Atomic monolayer deposition, ALD film is extremely conformal and the thickness is controlled by angstrom level during the film growth. ALD can also be used to form the silicon-metal thin film anode layer 120.

Molecular layer deposition (MLD) is very similar to ALD based on self-limiting and sequential surface chemistries. MLD can also be used to form the silicon-metal thin film anode layer 120. Similar to ALD, MLD is pin-hole free or defect free thin film fabrication process. In addition, MLD is very useful technique for flexible, low dense and low modulus thin film fabrication due to the molecular fragment deposited as the film is grown at low temperature. This can be helpful when forming a flexible anode thin film.

A multiple slit gas source head can be used instead of sources 302A, 302B, the substrate 102 of the multiple slit gas source head can be moved relative to each other for each deposition process. The gas source head can include a series of channels that spatially separate the reactants. This design allows for two sequential depositions of A material and B material layers or multiple sequential depositions as one AB cycle during one complete back-and-forth translation of the substrate 102. The gap spacing between the multiple slit gas source head and substrate 102 can be fixed or variable and can be from about 10 micrometers to about 15 centimeters.

ALD and MLD can use nitrogen ($N_2$) as a carrier and tag gas to determine operating conditions that prevent gas phase reactant cross diffusion. The mechanical tolerances were sufficient to allow back-and-forth translation of the substrate at a gap spacing of about 30 micrometer between the multiple slit gas source head and substrate 102.

Laser-assisted deposition (LAD) is high quality single layer or multilayer epitaxial metal oxide thin film fabrication technique on large and complex surfaced substrate based on laser ablation. Due to the simplicity and cleanliness, LAD is variable method to produce high quality thin films using a small target which is important in handling safety and toxicity at relatively low temperature.

Figure 3B:
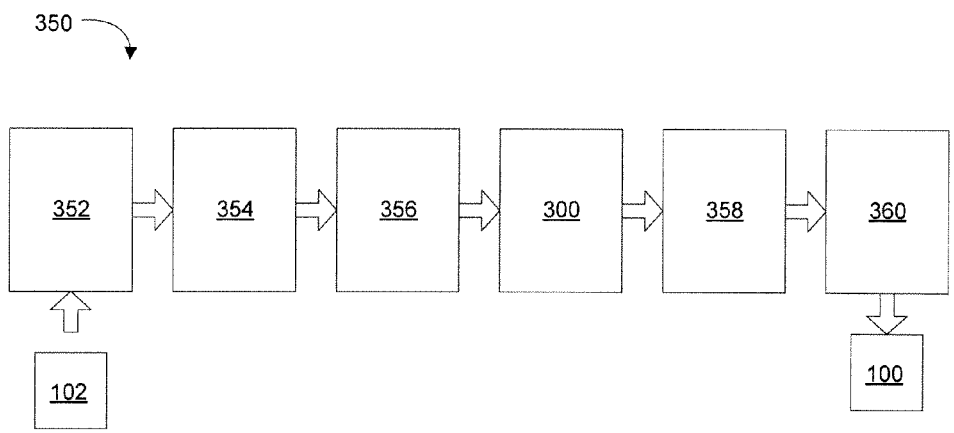
FIG. 3B is a simplified schematic view of a production system for production of the thin film battery, in accordance with embodiments of the present invention.

FIG. 3B is a simplified schematic view of a production system 350 for production of the thin film battery 100, in accordance with embodiments of the present invention. The production system 350 includes multiple processing stations 300, 352-360. Each of the processing stations can form one or more of the respective layers 104, 105, 110, 120, 130 on a substrate 102 to form the thin film battery 100. By way of example, a substrate 102 can be moved to processing station 352 where the current collectors 104, 106 are formed on the substrate. The substrate 102 can then move to processing station 354 where a lithium containing cathode layer 105 is formed. The substrate 102 can then move to processing station 356 where the electrolyte layer 110 is formed. The substrate 102 can then move to processing station 300 where the silicon-metal thin film anode layer 120 is formed. The substrate 102 can then move to processing station 358 where the conductive layer 130 is formed. Additional processing stations such as cleaning, etching, masking, drying etc. can also be included intermixed as necessary in the processing stations 300, 352-360.

Figure 4:
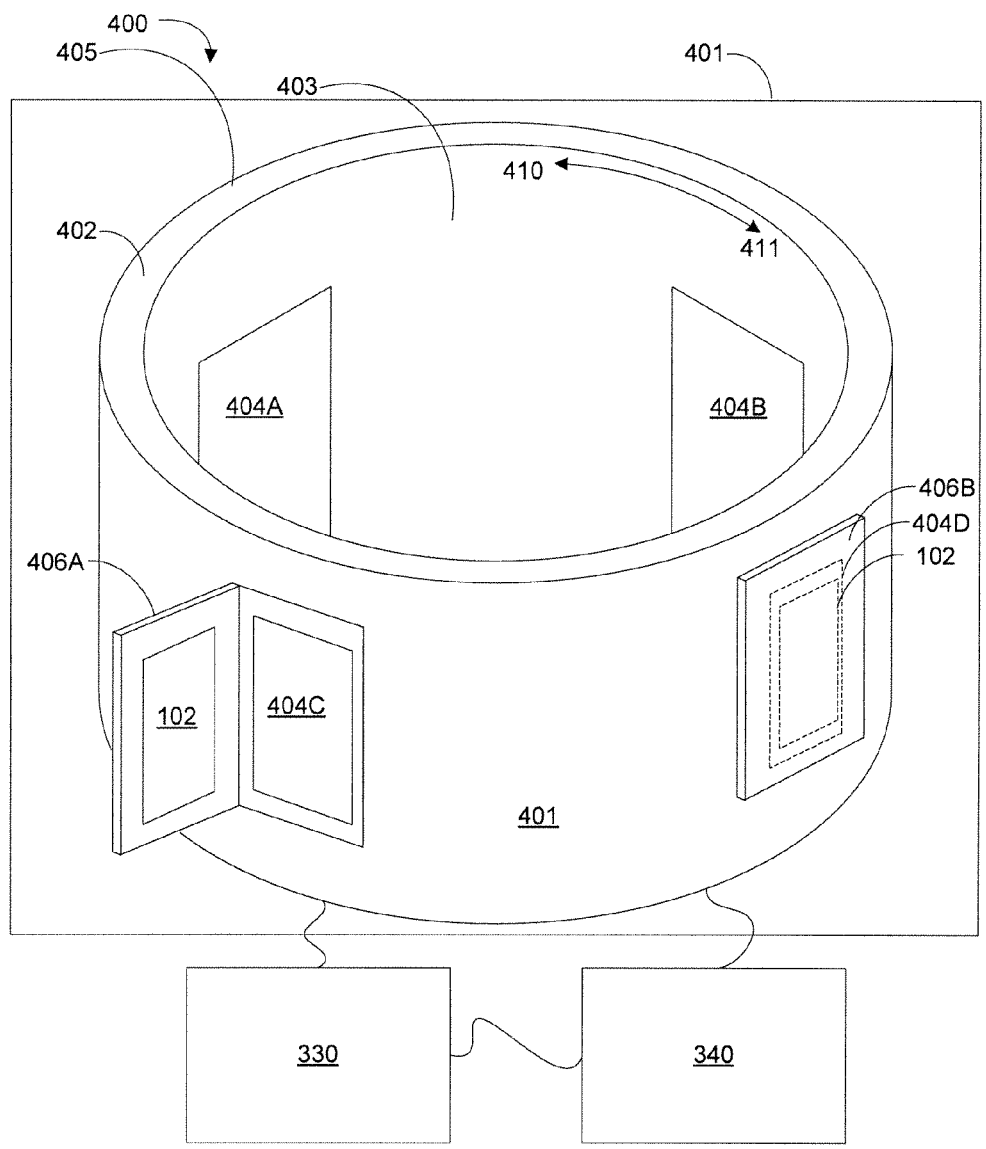
FIG. 4 is a simplified schematic view of a rotary deposition system, in accordance with embodiments of the present invention.

FIG. 4 is a simplified schematic view of a rotary deposition system 400, in accordance with embodiments of the present invention. The rotary deposition system 400 includes a chamber 401 having a rotary transportation system 405 and multiple deposition sources 404A-D. A substrates 102 can be placed in substrate holders 406A-D and the deposition sources 404A-D transported in directions 410, 411 by the rotary transportation system 405 to pass each of the deposition sources 404A-D past each of the substrate holders 406A-D. A controller 330 and one or more process gas source(s) 340 are also coupled to the chamber 401. The chamber 401 can also include one or more gas curtains (not shown) separating the substrate holders 406A-D.

The rotary deposition system 400 has a dual wall structure formed by the outer wall 403 and the rotary transportation system 405. In an exemplary embodiment, the diameter of the outer wall 403 is about 60 inches (150 cm) and the rotary transportation system 405 has a diameter of about 51-56 inches (125-140 cm). The gap spacing between outer wall 403 and the rotary transportation system 405 is about 3-8 inches (7-20 cm) and each wall thickness is about 0.5 inches (1.2 cm).

The base pressure is about $10^{-6}$ Torr and reactant partial pressure is about 5-20 mTorr in the chamber 401 during the film deposition. The rotary transportation system 405 can have a rotating speed that is variable in the range of 1 to 1,000 rpm.

The substrate holders 406A-D have a substantially rectangular design and can be formed of stainless steel. The substrate holders, chamber 401, the outer wall 403 and the rotary transportation system 405 can be formed from any suitable material. By way of example, stainless steel is an ideal material for substrate holders, chamber 401, the outer wall 403 and the rotary transportation system 405. The substrate holders can include a molded end piece or grip for easier handling in the rotary deposition system 400.

The substrate holder 406A-D can have a length of about 15 inches (35 cm) and a width of about 6 inches (15 cm), and a depth of about 0.5 inch (1.2 cm). It should be understood that while only four substrate holders 406A-D and sources 404A-D are illustrated, more or less than four substrate holders and sources can be used and the number of substrate holders and sources can be different. By way of example, six sources can be used to form the hybrid silicone-soft metal thin film anodes on one, two, three or four substrates.

The rotary deposition system 400 has can also be used as a spatial reactor for mass production under atmospheric pressure and ambient temperature conditions.

Figure 5:
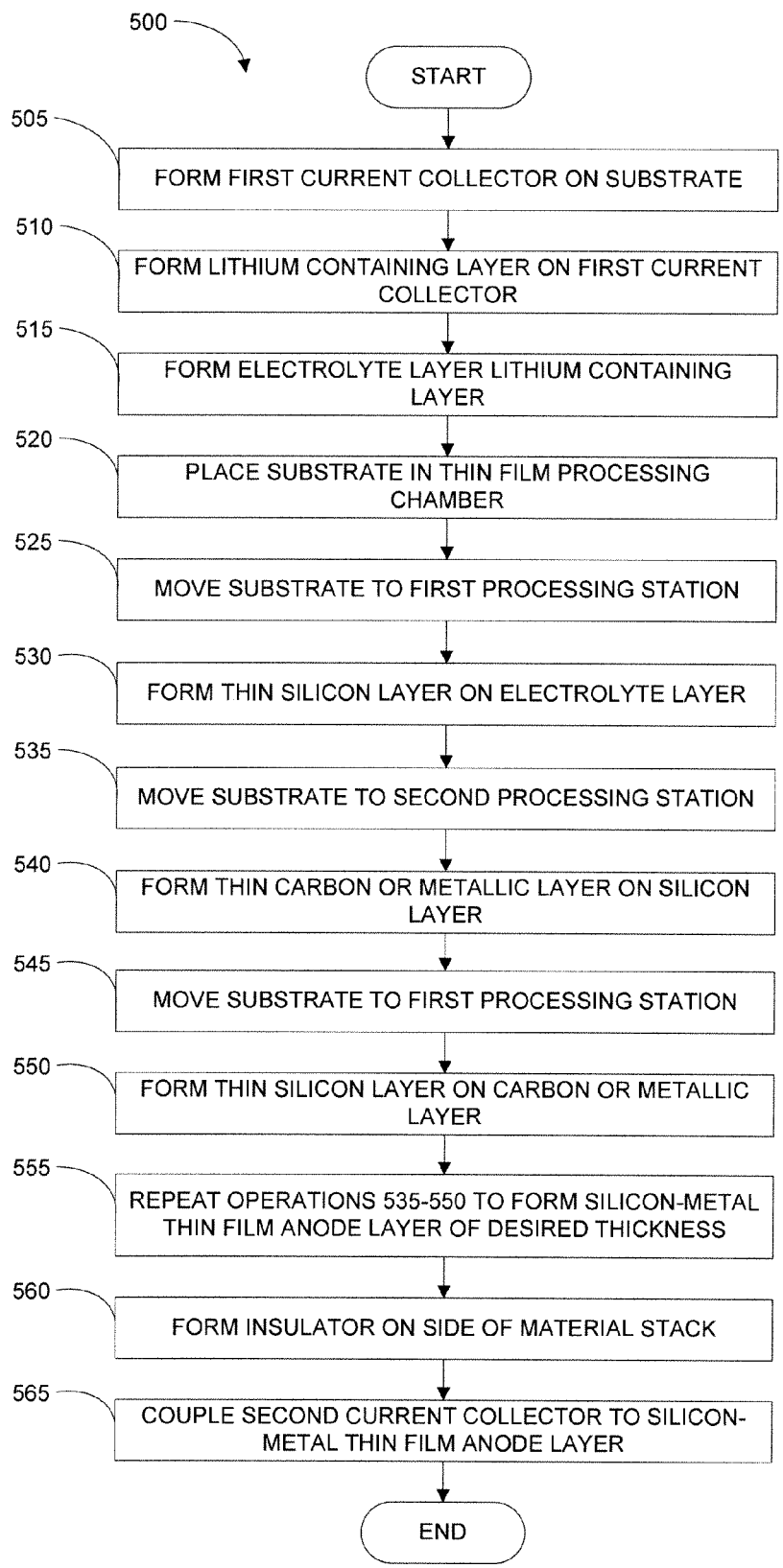
FIG. 5 is a flowchart diagram that illustrates the method operations performed in forming the thin film battery, in accordance with one embodiment of the present invention.

FIG. 5 is a flowchart diagram that illustrates the method operations 500 performed in forming the thin film battery 100, in accordance with one embodiment of the present invention. The operations illustrated herein are by way of example, as it should be understood that some operations may have sub-operations and in other instances, certain operations described herein may not be included in the illustrated operations. With this in mind, the method and operations 500 will now be described.

In an operation 505, a first current collector 104 is formed on a substrate 102 in a processing chamber or station. Forming the first current collector 104 can optionally include forming a second current collector 106. Forming the first current collector 104 can include a masking operation to mask the area of the substrate 102 where the first current collector 104 is not formed. Forming the first current collector 104 can also include an etching, cleaning and planarizing operations to remove masking materials and/or any unnecessary portions of the first current collector 104.

In an operation 510, the lithium containing cathode layer 105 is formed on the first current collector 104. As with forming the first current collector 104, forming the lithium containing cathode layer 105 can include masking operations to mask the area of the substrate 102 where the electrolyte layer is not formed and/or an etching, cleaning and planarizing operations to remove masking materials and/or any unnecessary portions of the lithium containing layer.

In an operation 515, the electrolyte layer 110 is formed on the lithium containing cathode layer 105. As with forming the first current collector 104 and forming the lithium containing cathode layer 105, forming the electrolyte layer 110 can include masking operations to mask the area of the substrate 102 where the electrolyte layer is not formed and/or an etching, cleaning and planarizing operations to remove masking materials and/or any unnecessary portions of the electrolyte layer.

In an operation 520, the substrate 102 is placed in a thin film processing chamber 301, 401. The substrate 102 can be placed on a substrate holder for processing in the processing chamber 301, 401. The substrate is moved to a first processing station 304A, 404A, in an operation 525, where a thin (e.g., between 1 nm and about 499 nm) silicon layer 202 is formed on the electrolyte layer 110 in an operation 530.

In an operation 535 the substrate 102 is moved to a second processing station 304B, 404B where a thin (e.g., between 1 nm and about 499 nm) carbon and/or metallic layer 204 is formed on the thin silicon layer 202 in an operation 540.

The substrate is moved to a first processing station 304A, 404A, in an operation 545, where a thin (e.g., between 1 nm and about 499 nm) silicon layer 202 is formed on the thin carbon and/or metallic layer 204 in an operation 550.

In an operation 555, operations 535-550 are repeated in an iterative fashion to form the silicon-metal thin film anode layer 120 of the desired thickness. Forming the silicon-metal thin film anode layer 120 can include masking operations to mask the area of the substrate 102 where the silicon-metal thin film anode layer is not formed and/or an etching, cleaning and planarizing operations to remove masking materials and/or any unnecessary portions of the silicon-metal thin film anode layer.

In an operation 560, an insulator 122 is formed on the side 110A of the material stack of layers 104, 105, 110, 120. In an operation 565, conductive layer 130A is formed on the top surface 120A of the silicon-metal thin film anode layer 120. Forming the conductive layer 130A formed on the top surface 120A of the silicon-metal thin film anode layer 120 can include electrically coupling to the second current collector 106. As described above, forming the conductive layer 130A on the top surface 120A of the silicon-metal thin film anode layer 120 can also include forming the second current collector 106B and an conductor 130B electrically coupling the conductive layer 130A to the second current collector 106B. It should also be understood that the conductive layer 130A on the top surface 120A of the silicon-metal thin film anode layer 120 can be used as the second current collector 106B as may be needed depending on the physical connection requirements of the resulting battery 100. The method operations can then end.

Figure 6:
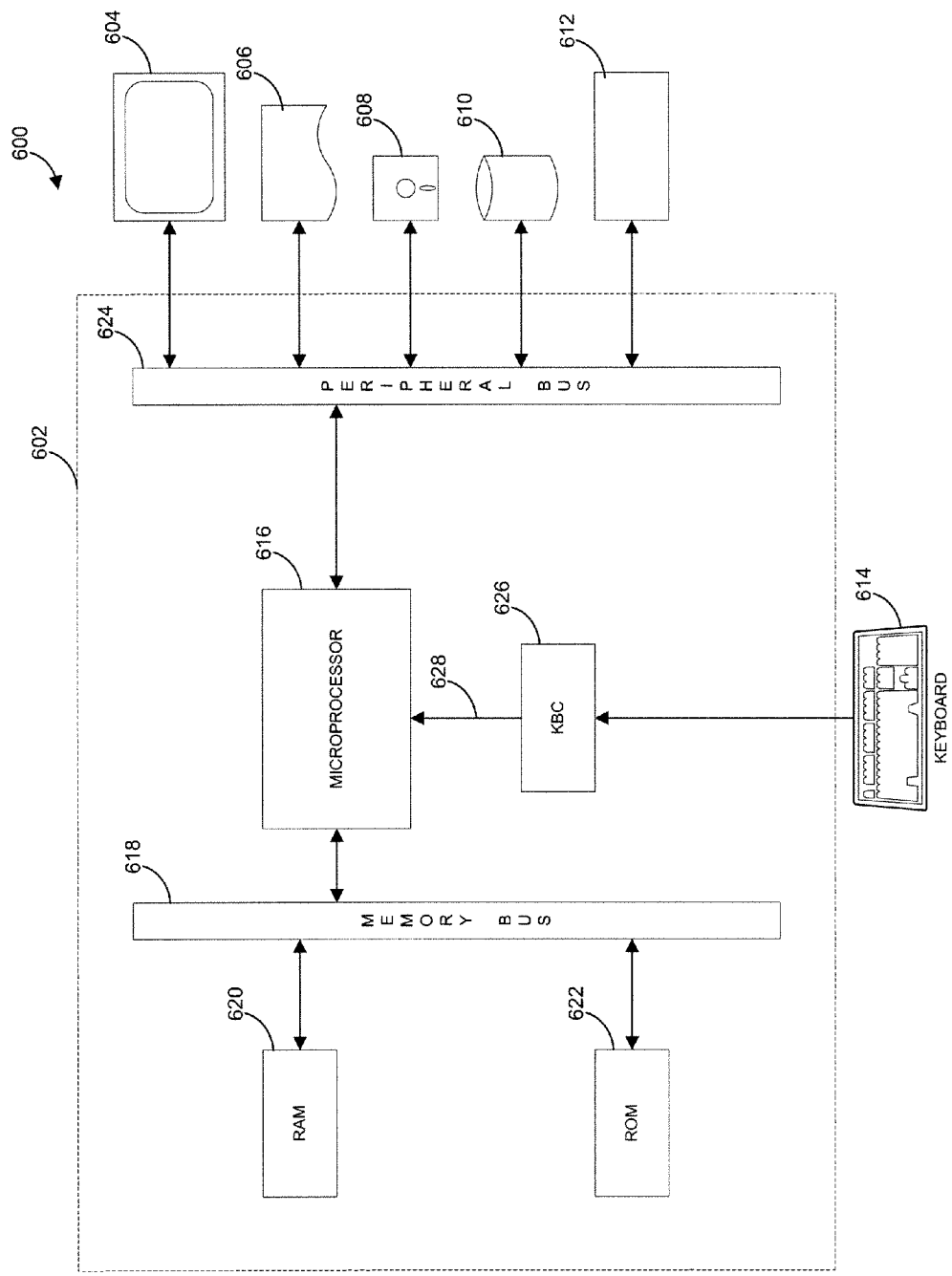
FIG. 6 is a block diagram of an exemplary computer system for carrying out the processing according to the invention.

FIG. 6 is a block diagram of an exemplary computer system 600 for carrying out the processing according to the invention. The computer system 600 can be coupled to the deposition systems 300, 400 and production system 350 to control the operations of the processing chamber (e.g., controller 330). The computer system 600 includes a digital computer 602, a display screen (or monitor) 604, a printer 606, a floppy disk or other computer readable media that is removable 608, a hard disk drive or similar persistent storage device 610, a network interface 612, and a keyboard 614. The digital computer 602 includes a microprocessor 616, a memory bus 618, random access memory (RAM)

620, read only memory (ROM) 622, a peripheral bus 624, and a keyboard controller (KBC) 626. The digital computer 602 can be a personal computer (such as an IBM compatible personal computer, a Macintosh computer or Macintosh compatible computer), a workstation computer (such as a Sun Microsystems or Hewlett-Packard workstation), or some other type of computer.

The microprocessor 616 is a general purpose digital processor, which controls the operation of the computer system 600. The microprocessor 616 can be a single-chip processor or can be implemented with multiple components. Using instructions retrieved from memory, the microprocessor 616 controls the reception and manipulation of input data and the output and display of data on output devices.

The memory bus 618 is used by the microprocessor 616 to access the RAM 620 and the ROM 622. The RAM 620 is used by the microprocessor 616 as a general storage area and as scratch-pad memory, and can also be used to store input data and processed data. The ROM 622 can be used to store instructions or program code followed by the microprocessor 616 as well as other data.

The peripheral bus 624 is used to access the input, output, and storage devices used by the digital computer 602. In the described embodiment, these devices include the display screen 604, the printer device 606, the floppy disk drive 608, the hard disk drive 610, and the network interface 612. The keyboard controller 626 is used to receive input from keyboard 614 and send decoded symbols for each pressed key to microprocessor 616 over bus 628.

The display screen 604 is an output device that displays images of data provided by the microprocessor 616 via the peripheral bus 624 or provided by other components in the computer system 600. The printer device 606, when operating as a printer, provides an image on a sheet of paper or a similar surface. Other output devices such as a plotter, typesetter, etc. can be used in place of, or in addition to, the printer device 606.

The floppy disk or other removable computer readable media 608 and the hard disk drive or other persistent storage media 610 can be used to store various types of data. The floppy disk drive 608 facilitates transporting such data to other computer systems, and hard disk drive 610 permits fast access to large amounts of stored data.

The microprocessor 616 together with an operating system operate to execute computer code and produce and use data. The computer code and data may reside on the RAM 620, the ROM 622, or the hard disk drive 610. The computer code and data could also reside on a removable program medium and loaded or installed onto the computer system 600 when needed. Removable program media include, for example, CD-ROM, PC-CARD, floppy disk, flash memory, optical media and magnetic tape.

The network interface 612 is used to send and receive data over a network connected to other computer systems. An interface card or similar device and appropriate software implemented by the microprocessor 616 can be used to connect the computer system 600 to an existing network and transfer data according to standard protocols.

The keyboard 614 is used by a user to input commands and other instructions to the computer system 600. Other types of user input devices can also be used in conjunction with the present invention. For example, pointing devices such as a computer mouse, a track ball, a stylus, or a tablet can be used to manipulate a pointer on a screen of a general-purpose computer.

Figure 7:
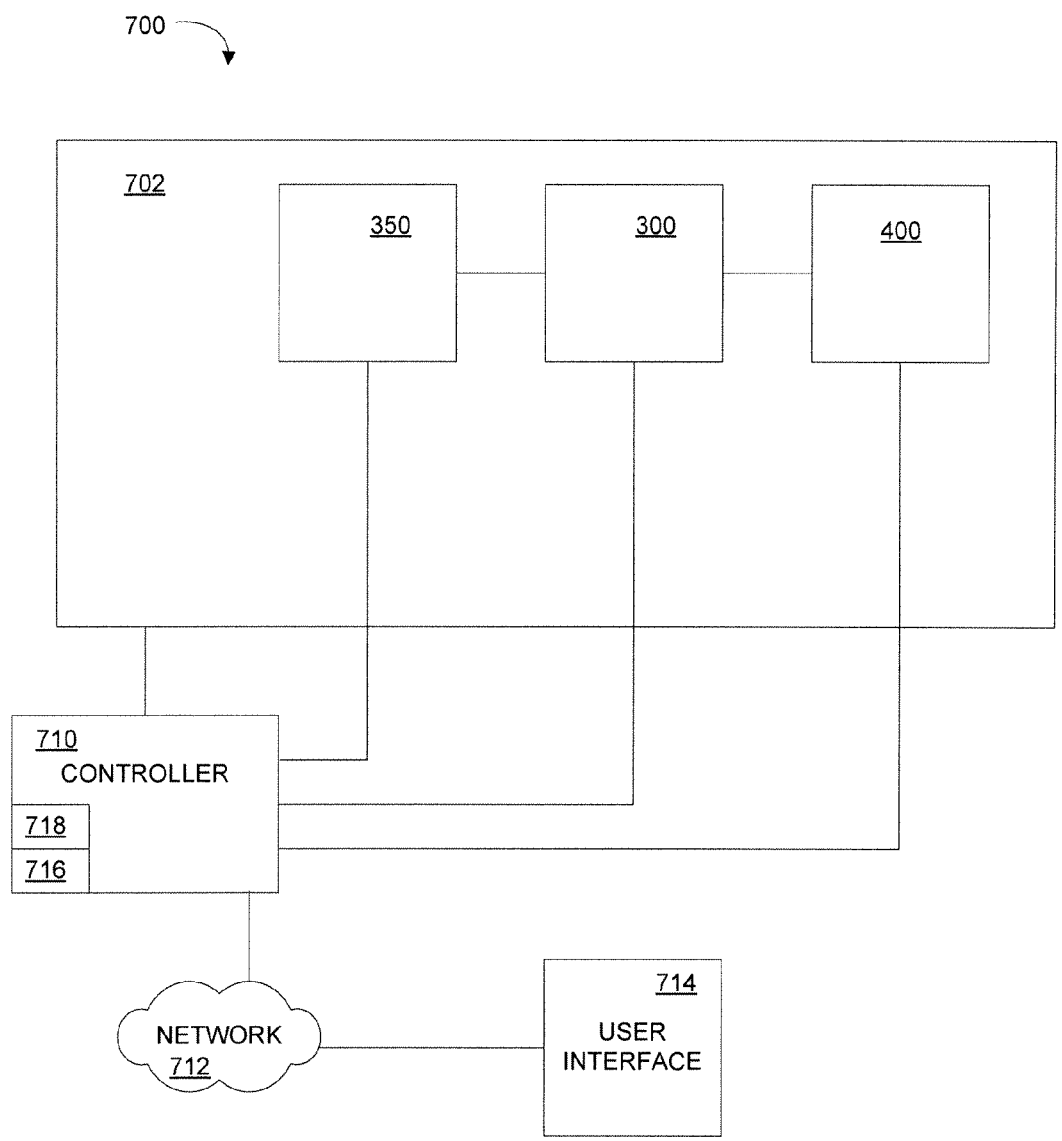
FIG. 7 is a block diagram of an integrated system including one or more of the deposition systems and production system, in accordance with an embodiment of the present invention.

FIG. 7 is a block diagram of an integrated system 700 including one or more of the deposition systems 300, 400 and production system 350, in accordance with an embodiment of the present invention. The integrated system 700 includes the one or more of the deposition systems 300, 400 and production system 350 and an integrated system controller 710 coupled to the deposition and production system (s). The integrated system controller 710 includes or is coupled to (e.g., via a wired or wireless network 712) a user interface 714. The user interface 714 provides user readable outputs and indications and can receive user inputs and provides user access to the integrated system controller 710.

The integrated system controller 710 can include a special purpose computer or a general purpose computer. The integrated system controller 710 can execute computer programs and/or logic 716 to monitor, control and collect and store data 718 (e.g., performance history, analysis of performance or defects, operator logs, and history, etc.) for the deposition systems 300, 400 and production system 350. By way of example, the integrated system controller 710 can adjust the operations of the deposition systems 300, 400 and production system 350 and/or the components therein (e.g., the temperatures, flow rates, pressures, locations, movement, loading and unloading of the substrate 102, etc.) if data collected dictates an adjustment to the operation thereof.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code and/or logic on a computer readable medium. The computer readable medium is any data storage device that can store data which can thereafter be read by a computer system. Examples of the computer readable medium include hard drives, network attached storage (NAS), logic circuits, read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A battery comprising:
    a substrate;
    a first current collector formed on the substrate;

a cathode layer formed on a portion of the first current collector;

a layer of solid electrolyte material formed on the cathode layer;

a thin film anode layer formed on the layer of solid electrolyte material, wherein the thin film anode layer includes a plurality of adjacent pairs of alternating layers of material, wherein each pair of alternating layers includes a first layer and a second layer, wherein the first layer consists of silicon, and wherein the second layer includes a non-silicon material and wherein the non-silicon material is different in two or more of the second layers; and a second current collector electrically coupled to the thin film anode layer.

2. The battery of claim 1, wherein the non-silicon material includes at least one of carbon, tin, silver, aluminum, indium, titanium, thallium, copper, or any combination thereof.

3. The battery of claim 1, wherein each pair of alternating layers has a thickness of between about 2 nanometers and about 500 nanometers.

4. The battery of claim 1, wherein the first layer of each pair has a thickness of between about 1 nanometer and about 499 nanometers.

5. The battery of claim 4, wherein the second layer of each pair of alternating layers has a thickness of between about 1 nanometer and about 499 nanometers.

6. The battery of claim 1, wherein the thin film anode layer includes a ratio composition of between about 1% to about 99% of silicon and of between about 99% to about 1% of the non-silicon material.

7. The battery of claim 1, wherein a sum of the thickness of the first current collector, the cathode layer, the layer of solid electrolyte material and the thin film anode layer is between about 3 micrometers to about 50 micrometers.

8. The battery of claim 1, wherein the thin film anode layer has a thickness of between about 2 micrometers and about 10 micrometers.

9. The battery of claim 1, wherein the solid electrolyte layer has a thickness of between about 0.50 micrometers to about 10 micrometers.

10. The battery of claim 1, wherein the substrate is a flexible substrate.

11. A method of forming a thin film battery comprising:
forming a first current collector on a substrate;
forming a cathode layer on the first current collector;
forming a solid electrolyte layer on the cathode layer;
forming a thin film anode layer on the solid electrolyte layer, wherein forming the thin film anode layer includes:

forming, at a first processing station, a first layer on the electrolyte layer, wherein the first layer consists of silicon;

transporting, after forming the first layer, the substrate from the first processing station to a second processing station;

forming, at the second processing station, a second layer on the first layer, wherein the second layer includes a first non-silicon material;

transporting, after forming the second layer, the substrate from the second processing station to the first processing station;

forming, at the first processing station, a third layer on the second layer, wherein the third layer consists of silicon;

transporting, after forming the third layer, the substrate from the first processing station to the second processing station; and forming, at the second processing station, a fourth layer on the third layer, wherein the fourth layer includes a second non-silicon material that is different from the first non-silicon material; and coupling the thin film anode layer to a second current collector.

12. The method of claim 11, wherein the first layer and the second layer have a combined thickness of between about 2 nanometers and about 500 nanometers.

13. The method of claim 11, wherein the first processing station and the second processing station are included in a single processing chamber having a first source configured to supply silicon to the first processing station, a second source configured to supply the non-silicon material to the second processing station, and a transport system configured to transport the substrate between the first processing station and the second processing station in an alternating manner.

14. The method of claim 11, wherein the first processing station and the second processing station are included in a rotary processing chamber having a first source configured to supply silicon to the first processing station, a second source configured to supply the non-silicon material to the second processing station, and a rotary transport system configured to transport the substrate between the first processing station and the second processing station in an alternating manner.

15. The method of claim 11, wherein the non-silicon material includes at least one of carbon, tin, silver, aluminum, indium, titanium, thallium, copper, or any combination thereof.

* * * * *